(12) United States Patent
Létourneau et al.

(10) Patent No.: US 6,757,470 B2
(45) Date of Patent: Jun. 29, 2004

(54) FACEPLATE COMBINATION

(75) Inventors: Fabien Létourneau, Aylmer (CA); Christopher J. Kavanagh, Nepean (CA)

(73) Assignee: Alcatel Canada Inc., Kanata (CA)

( * ) Notice: Subject to any disclaimer, the term of this patent is extended or adjusted under 35 U.S.C. 154(b) by 0 days.

(21) Appl. No.: 10/012,431

(22) Filed: Dec. 12, 2001

(65) Prior Publication Data

US 2003/0108320 A1 Jun. 12, 2003

(51) Int. Cl.⁷ .............................................. G02B 6/00
(52) U.S. Cl. ...................................................... 385/134
(58) Field of Search ................................ 385/134, 135, 385/53, 55, 138, 147

(56) References Cited

U.S. PATENT DOCUMENTS

| | | | | |
|---|---|---|---|---|
| 5,096,439 A | * | 3/1992 | Arnett | 439/536 |
| 5,638,481 A | | 6/1997 | Arnett | 385/135 |
| 5,708,742 A | | 1/1998 | Beun et al. | 385/53 |
| 5,896,477 A | * | 4/1999 | Stephenson et al. | 385/53 |
| 5,949,946 A | | 9/1999 | Debortoli et al. | 385/134 |
| 6,193,420 B1 | | 2/2001 | Sikorski, Jr. | 385/55 |
| 6,419,399 B1 | * | 7/2002 | Loder et al. | 385/53 |

* cited by examiner

Primary Examiner—Javaid H. Nasri
(74) Attorney, Agent, or Firm—Marks & Clerk

(57) ABSTRACT

A faceplate having at least one opening with a cover. The cover may be removed after initial use of a circuit board to be replaced with a connector unit through which conductors may extend to the circuit board to allow for its modification in operation. This enables the same faceplate to be used for modification purposes and without the expense entailed with a faceplate of different design. The cover may be such as to completely cover the whole of the opening. Alternatively, the cover may be provided by a connector unit which enables interconnection of conductors through the faceplate in one part of the unit while providing, in another part of the unit, the cover for part of the opening. This connector unit may then be replaced in the modification by another connector unit which enables connectors to extend and be connected through the whole of the opening. Conveniently, a latching arrangement is provided for assembly and disassembly purposes for both the cover and connector unit with frontal access. This provides speed of operation with no loose parts required. Also included is a method for providing the inventive modification.

16 Claims, 8 Drawing Sheets

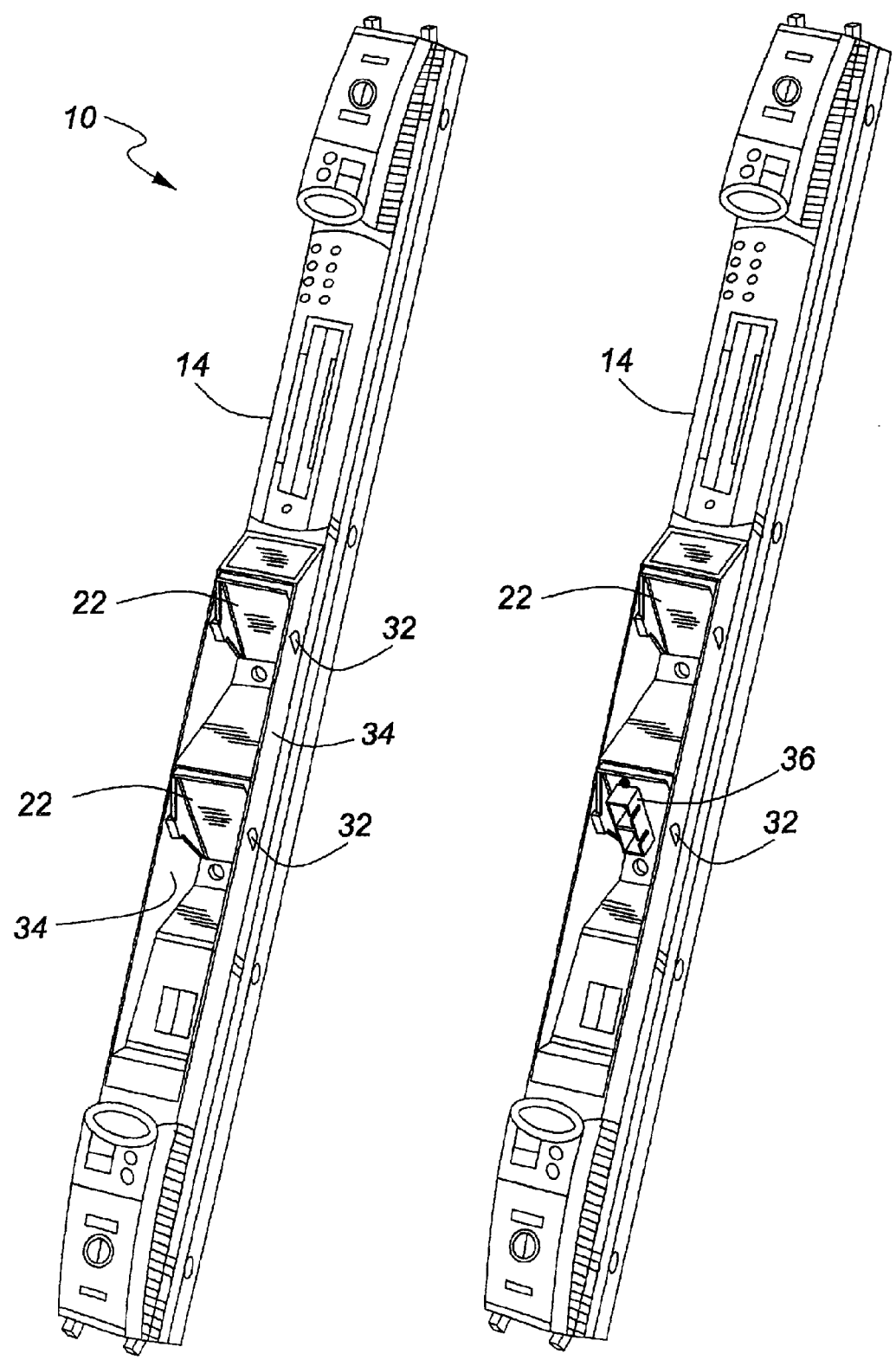
FIG. 3  FIG. 9

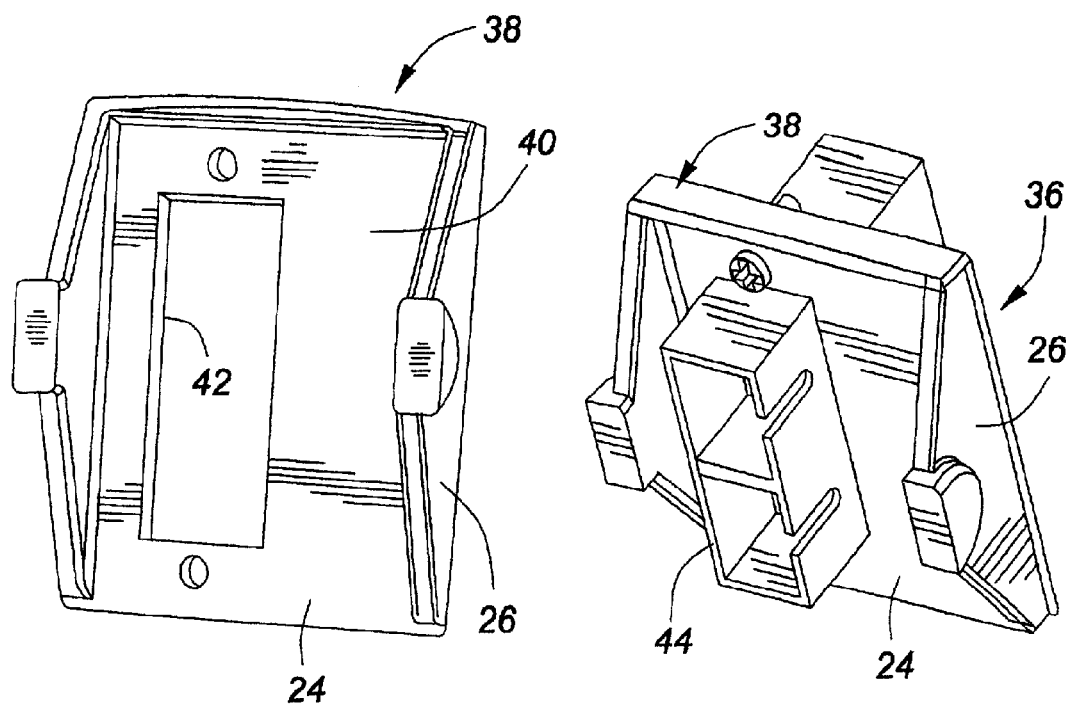
FIG. 6
FIG. 7
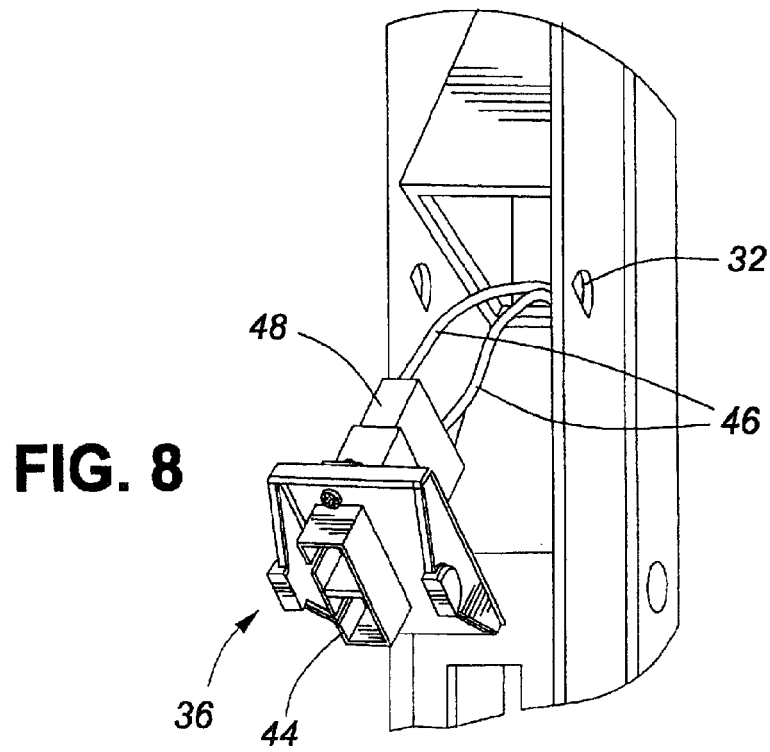
FIG. 8

FIG. 13  FIG. 15

FACEPLATE COMBINATION

FIELD OF THE INVENTION

This invention relates to faceplate combinations.

BACKGROUND OF THE INVENTION

Circuit packs to be mounted in shelves have faceplates at front edges of printed circuit boards of the packs, the faceplates lying side-by-side across the fronts of the shelves to provide substantially continuous walls. The printed circuit boards in a shelf are interconnected either between themselves or with other electrical, electronic or optical equipment outside the shelf through a back or mid-plane of the shelf. In addition, in order to enable the printed circuit boards to perform their desired functions, electrical or optical connections are required through the faceplates to outside electrical or optical equipment. These connections are made through connector units carried by the faceplates. These connector units comprise connectors joined directly together at faceplates or connectors which are interconnected by electrical or optical adaptors carried by the faceplates. For mounting to the faceplates, carriers holding adaptors or connectors may be mounted upon the faceplates. An example of such a structure is described in U.S. Pat. No. 5,949,946, granted to G. Debortoli et al, on Sep. 7, 1999.

While printed circuit boards are designed to provide certain functional requirements directly upon commencement of use, it is now becoming more common to design printed circuit boards not only for their immediate use capabilities, but also to enable them to have their functional requirements modified at some future time, e.g. perhaps to affect the functional requirements of their shelves. In this regard, a printed circuit board for instance may be designed for initial use without a daughter board, but has the provision to carry a daughter board at some future time thereby increasing the number of terminals for connection to outside sources or equipment.

Obviously, change in functional requirements to a printed circuit board under the above circumstances, as it occurs after some use, needs to be effected in the field. Typically to effect functional change, an "upgrade kit" is sent to the field, such a kit including, for each printed circuit board that requires modification, a new faceplate to replace the existing faceplate. The new faceplate differs basically from the existing faceplate in that it is designed to carry more connector units than the existing faceplate, for the purpose of providing access for more interconnections from printed circuit board terminals to outside sources or equipment. Thus the existing faceplate, after removal, is likely to become a scrap item while the new faceplate creates additional expense, together with the original expense incurred in the design of the new faceplate.

In addition, the time taken to effect modifications to a printed circuit board in the field tends to be inordinately lengthy. Conventionally, this involves forward movement of a circuit pack in its shelf to provide access, disconnection of connectors from the faceplate (rear access to the faceplate being required for this latter purpose), and disconnection of elongate transmission elements, i.e. optical or electrical cables or wires, from printed circuit board terminals. This results in the further expense of replacing existing items with new items of the circuit pack and an inconvenient number of such items may be involved. This increases the difficulty and time required for the modification process and also increases the possibility of unattached items becoming mislaid (thus adding to further down time, or even the potential hazard of losing small items within the shelf itself, which could lead to electrical or optical malfunction or structural damage.

Further, the tools required for present printed circuit board modification procedures may, if carelessly or inappropriately used, cause damage to circuitry on a board, particularly during the stages of removal and replacement of a faceplate, and of providing access to the rear of the faceplate for connector or adaptor removal. The only known way to limit or avoid some of the above problems is to completely replace a circuit pack with a new pack which includes the necessary differences to effect modification in performance.

SUMMARY OF THE INVENTION

The present invention seeks to mitigate or lessen the above problems.

According to one aspect of the present invention, there is provided, in combination, a faceplate and a cover, wherein:
 the faceplate has a front side and a rear side and opening means extending from the front to the rear side of the faceplate; and
 the cover is provided for location in a position over at least a part of the opening means with the cover being capable of being removed from the at least one part of the opening means to enable the in-series interconnection of two elongate transmission elements through the at least part of the opening means, a first of the transmission elements extending rearwardly from the faceplate and a second of the transmission elements extending forwardly from the faceplate.

In one arrangement of the inventive combination, the cover is provided by a connector unit as will be described. In another arrangement the cover is sufficiently large to completely close the opening means.

It is to be understood that in the latter paragraph, and throughout the remainder of the specification and in the claims, the term "connector unit" is intended to include structures incorporating either a) optical or electrical connectors or b) adaptors for interconnecting such connectors, unless specifically stated otherwise. Also, the term "connector means" as to be later used throughout the specification and in the claims, is intended to include such connectors or adaptors, unless specifically stated otherwise.

The above combination according to the invention has the advantage that the faceplate may itself be designed for any future modification which may be required by a circuit pack of which the faceplate is to form a part. In an arrangement with a connector unit providing the cover, the connector unit has a structure to enable a future modification to be made. In this arrangement, the connector unit has two regions, one of the regions being closed and the other of the regions having a port. The connector unit is for mounting in a mounting station in which the closed region provides the cover for part of the opening means. The port of the other region is directed to face through another and open part of the opening means for the in-series interconnection of two other transmission elements through the port, with one of the transmission elements extending rearwardly and the other transmission element extending forwardly from the faceplate. However, upon it being required to modify the operation of a printed circuit board, then this may be effected, importantly, without removal of the existing faceplate (together with avoidance of extra cost, downtime involved, and risk of damage to equipment), and without its replacement with a new faceplate having more access for connection to the printed circuit board.

In the arrangement using a connector unit with a closed region, a second connector unit may also be included. This second connector unit has two regions corresponding in position to the two regions of the first connector unit. The second connector unit may replace the first connector unit and a port provided in each of the regions of the second connector unit is directed to face through the opening means. Each port is individually provided for the in-series interconnection of two transmission elements. Thus, replacement of the first with the second connector unit upon the faceplate increases the number of elongate transmission elements which extend from in front of the faceplate and may be connected through the faceplate to the circuit board.

In the arrangement having a cover which completely covers the opening means, a connector unit may be provided having two regions, one or both of which is provided with a port, similar to either the first or second connector unit described above. It follows that for modifying the operation of the associated circuit pack, the cover may be completely removed and be replaced with either the first or second connector unit to enable two elongate conductor elements to be interconnected in-series through the or each port of the connector unit for connection to the circuitry.

It follows from the above two arrangements of the invention that the same faceplate with the opening means, as discussed, may be employed for at least one and possibly more modifications to be made to the circuitry and thus to the operation of the circuit pack. Hence, a replacement faceplate normally required for this purpose, together with its attendant cost and possible problems in the replacement procedure, is avoided.

In a preferred construction, quickly releasable means is provided which is co-operable between the faceplate and the connector unit for mounting the connector unit to the faceplate.

Conveniently, the quickly releasable means comprises a latching arrangement. With the latching arrangement, small items of assembly (e.g. screws etc.) are avoided together with tools necessary for their assembly and disassembly. Any potential problems associated with loss of such small items, particularly within the confines of a circuit pack, or within a shelf, are thus avoided.

In a further preferred construction, the latching arrangement includes a plurality of mounting flanges on the front side of the faceplate. With such an arrangement, the mounting plates are accessible from the front side for mounting a connector unit in a mounting position on the faceplate. Hence, the connector unit may be mounted simply upon the front side of the faceplate using the latching arrangement thereby avoiding the need for rear access to the faceplate for connector unit assembly purposes.

The invention also includes, in combination, a faceplate and a connector unit wherein:

the connector unit has at least one port for the in-series interconnection therethrough of two elongate transmission elements with the transmission elements extending in opposite directions from the connector unit; and the faceplate has a front side and a rear side, the rear side provided for connection with a printed circuit board, the faceplate also having opening means extending from side to side of the faceplate and also having a mounting structure located on the front side of the faceplate, the mounting structure accessible from the front side for mounting the connector unit in a mounting position on the faceplate with the at least one port facing in a direction through the opening means.

In addition, the invention includes a connector unit comprising a connector means and a carrier, the carrier having a base carrying the connector means and a plurality of latches provided by flanges extending resiliently from the base.

The invention also includes a method of modifying the operation of a circuit pack. In this method, a faceplate has a cover which closes opening means against transmission of electromagnetic signals through the opening means. The method generally comprises removing the cover and then interconnecting in series through the opening means, two elongate transmission elements to be connected to circuitry of the pack with one transmission element extending forwardly and the other transmission element extending rearwardly of the faceplate. Alternatively, a method is provided according to the invention in which a first connector unit is mounted to a faceplate, the connector unit having a port facing through the opening means and a region which is closed and covers part of the opening means. The first connector unit is replaced with a second connector unit having two ports, one of the ports corresponding in position to the closed region of the first connector unit. Each port of the second connector unit is used individually to interconnect in series two connector elements to be connected to the circuitry.

BRIEF DESCRIPTION OF THE DRAWINGS

One embodiment of the invention will now be described, by way of example, with reference to the accompanying drawings, in which:

FIG. 3 is an isometric view in the direction of arrow 111 in FIG. 1 of the combination;

FIG. 6 is a view similar to FIG. 5 of a carrier of a connector unit;

FIG. 7 is an isometric view of the complete connector unit;

FIG. 8 is a front isometric view of part of the faceplate and shows a stage during assembly of the connector unit of FIG. 7 on to the faceplate to form the combination of the embodiment;

FIG. 9 is a view similar to FIG. 3 of the connector unit assembled on to the faceplate;

FIG. 15 is a view similar to FIG. 9 of a further combination of the invention.

DESCRIPTION OF PREFERRED EMBODIMENT

Figure 1:
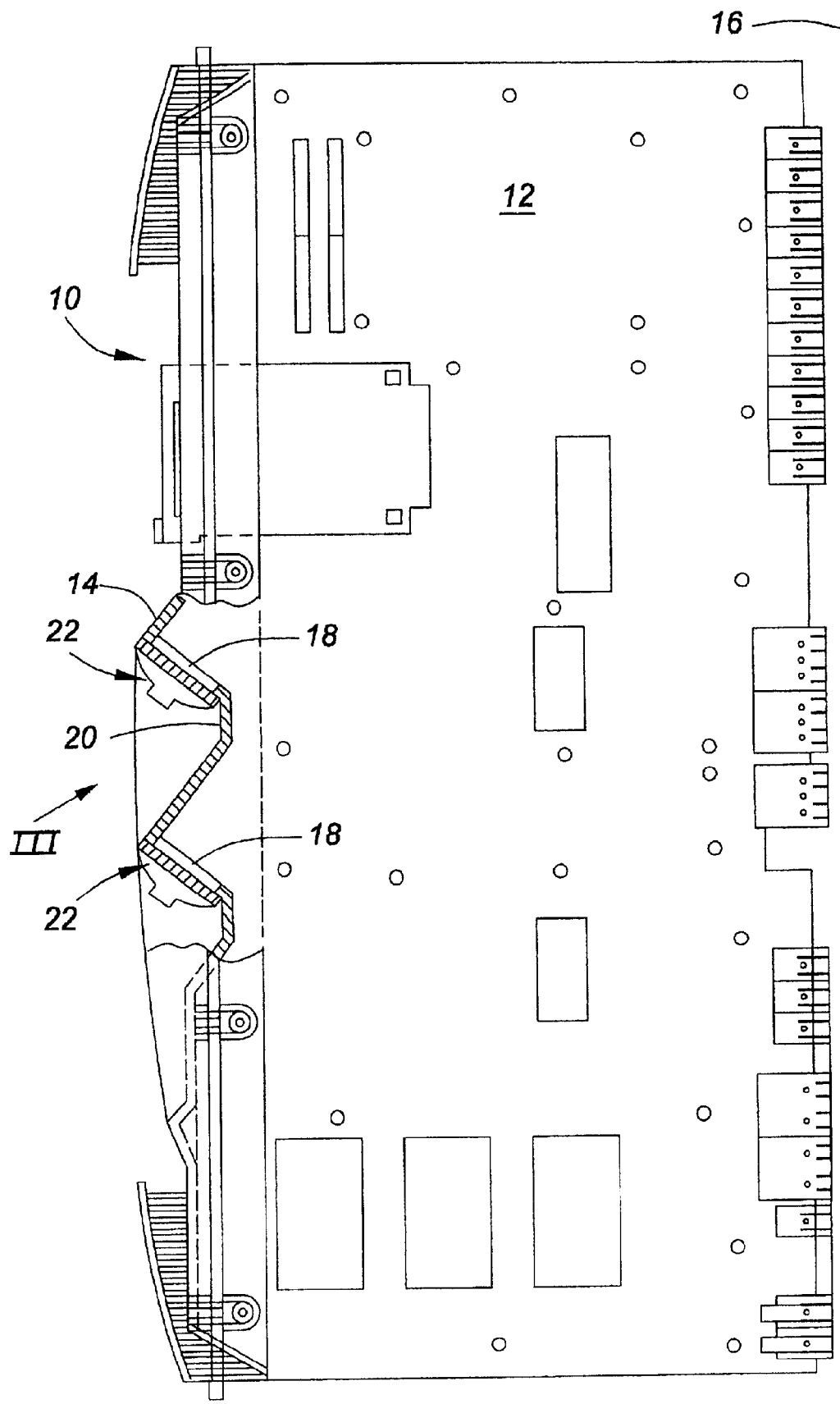
FIG. 1 is a side view partly in cross-section of a combination according to the invention attached to a printed circuit board.

In the embodiment as shown by FIG. 1, a combination 10 of faceplate and cover (to be described in more detail) is attached to a printed circuit board 12 of a circuit pack, the printed circuit board extending in conventional fashion from a rear side of the faceplate 14 to a back plane (shown diagramatically by its center line 16).

Figure 4:
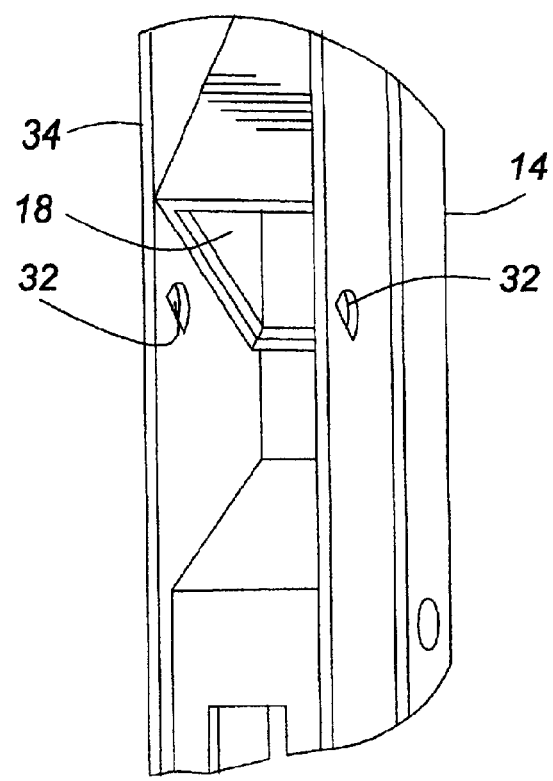
FIG. 4 is a view similar to FIG. 3 of part of a faceplate of the combination.

The faceplate 14 is constructed to enable modifications to be made to the operation of the printed circuit board after some usage. This avoids the necessity of having to change faceplates for modification purposes which is according to conventional procedure. With this object in mind the faceplate is provided with two opening means, each in the form of apertures 18, from a front side 20 to the rear side of the faceplate. The opening means are rectangular, as shown particularly by FIG. 4, and face downwardly in an inclined fashion while being spaced vertically apart in the faceplate.

In the combination 10 are also included two covers 22 for completely closing the apertures 18 to prevent the inadvertent transmission of electromagnetic signals through the apertures with the faceplate and circuit board in use within a shelf.

Figure 5:
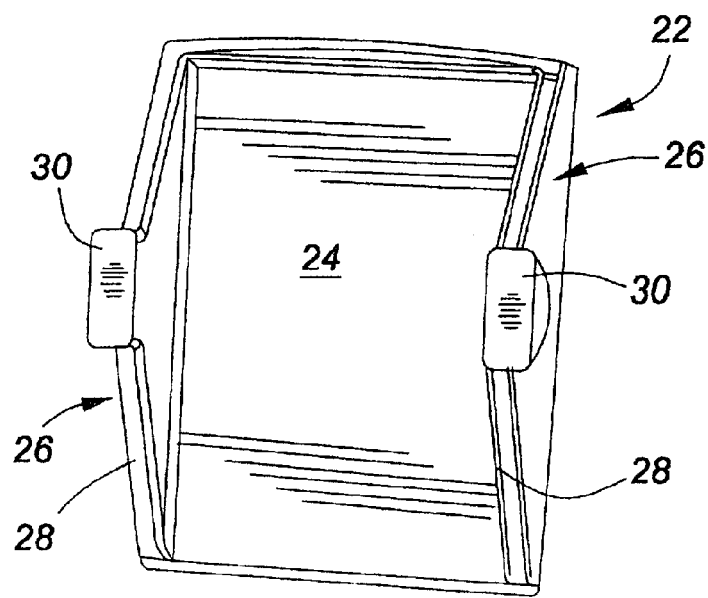
FIG. 5 is an enlarged isometric view of a cover forming part of the combination of the embodiment.

Each cover 22, as shown more clearly in FIG. 5, comprises a rectangular base 24 for completely closing its associated aperture. Each cover also has a plurality of latches (namely two) 26. The latches are provided by two flanges 28 which extend resiliently from opposite edges of the base 24, and latch heads 30 located at free ends of the flanges which are tapered towards these ends.

Figure 2:
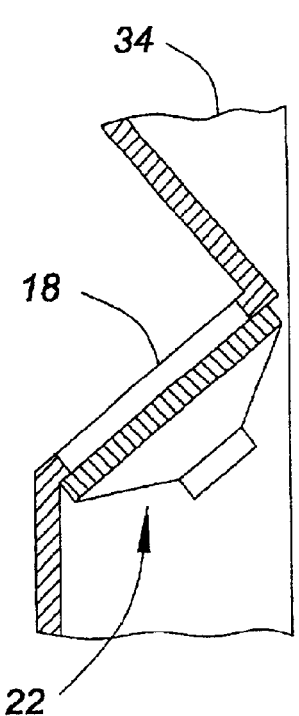
FIG. 2 is an enlarged cross-sectional view in the opposite direction to FIG. 1 of the combination.

Initially, the faceplate is provided with the two covers 22 located over the apertures to seal them, as discussed above. For location purposes, the covers are mounted in mounting positions by using the latches 26 which form part of a latching means which also includes apertures 32 in forwardly facing flanges 34 of the faceplate. As shown by FIG. 3, these apertures 32 are positioned to receive the latch heads 30 with the covers 22 in their mounting position or stations sealing the aperture 18. The latches 26 fit snugly between the flanges 34 of the faceplate (see also FIG. 2) and resilient flexing of the latches towards each other enables the latch heads to engage the apertures 32 during mounting of the covers.

As may be seen therefore from the above description, the faceplate 14 is initially not provided with signal transmitting means passing through the faceplate to the printed circuit board. In this state the printed circuit board is in circuit with other circuitry of its associated shelf through the back plane 16.

If at some future time it is required to update, i.e. modify, the operation of the printed circuit board 12 by interconnecting elongate transmission elements (either optical or electrical), through the faceplate, then it is unnecessary for the faceplate to be replaced. For the modification to take place, at least one of the covers 22 is replaced by a connector unit which may be of one of two different designs according to this embodiment.

In a first connector unit 36 (FIG. 7) a carrier 38 is provided, the carrier carrying a connector means for interconnecting in-series elongate transmission elements in the form of optical cables. The carrier (FIG. 6) is basically of the same design as the cover 22, i.e. it has a base 24 and latches 26. The base differs, however, from that of the cover 22 in that it has two regions, one region being provided with a rectangular port 42 and the other region 40 being closed. As shown by FIG. 7, the assembled connector unit includes, as its connector means, a dual SC adaptor 44 which is screwed into position into the port 42. Each adaptor of the dual adaptor is for the in-series interconnection of two optical cables.

Figure 10:
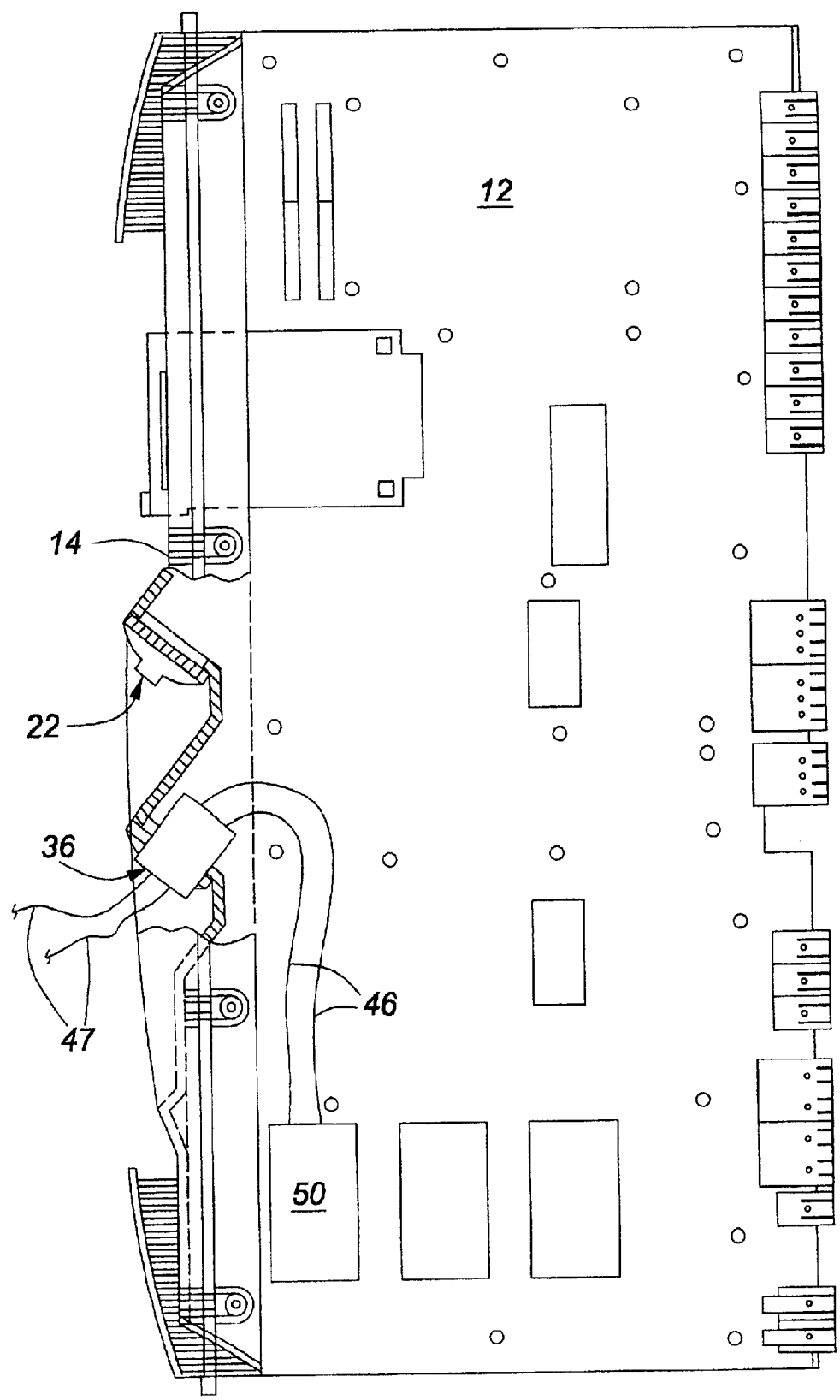
FIG. 10 is a view similar to FIG. 1 and showing conductors from the connector unit extending to terminals of the printed circuit board.

In the modification to the operation of the circuit board 12, as shown by FIGS. 9 and 10, the lower cover 22 is removed from its aperture 18 and the connector unit 36 is positioned in the mounting station over this aperture with the latching means holding the unit in place. The connector unit has two rearwardly extending optical cables 46 attached to connectors 48 and included in the connector unit assembly before the unit is located in the assembly station (FIG. 8). In the modification that has now taken place, the optical cables 46 are then connected into terminals of a component 50 mounted on the printed circuit board as shown by FIG. 10. Mere replacement of the one cover 22 with a connector unit 36 therefore enables modification in operation of the printed circuit board with each of the cables 46 extending rearwardly of the faceplate. The cables 46 are interconnected through the adaptor 44, selectively and in series, with one of two cables 47 extending forwardly from the faceplate and to exterior equipment.

In addition, the replacement of the cover with the connector unit 36 is simplified in operation by the position of the mounting. The mounting flanges 34 of the faceplate face forwardly as is shown by the Figures, so that the front side of the faceplate is accessible for assembling and disassembling the covers and the connector units on to the faceplate. Thus, the rear of the faceplate does not require access for assembly and disassembly purposes. In contrast, it is merely required to remove the desired cover 22 by manually flexing the latches 26 towards each other to disconnect them from within the apertures 32. Then, with the printed circuit board and faceplate moved forwardly of the shelf, the connector unit 36 is assembled from the front of the faceplate over the aperture 18 and is located in the mounting position as shown by FIG. 9. To this end, the optical cables 46 are merely fed in a rearward direction (FIG. 8) through the aperture 18 to be connected to their appropriate terminals on the board 12.

As may be seen therefore, with the frontal access and with the mounting at the front of the faceplate, together with the use of the latching arrangement, the modification is a quick and positive operation which does not require the use of tools for disconnecting items such as nuts and screws. This would avoid the possibility of such items becoming lost or lodged within the shelf itself, with possible disastrous results to the operation of the circuitry.

It will be understood that it is not necessary to have a connector unit with a dual adaptor such as item 44. A connector unit may be used as a replacement for a cover 22 and in which a single SC adaptor (not shown) is present sufficient only to connect two cables together, one such cable being forwardly of the faceplate and the other extending from the adaptor to the printed circuit board.

Figure 11:
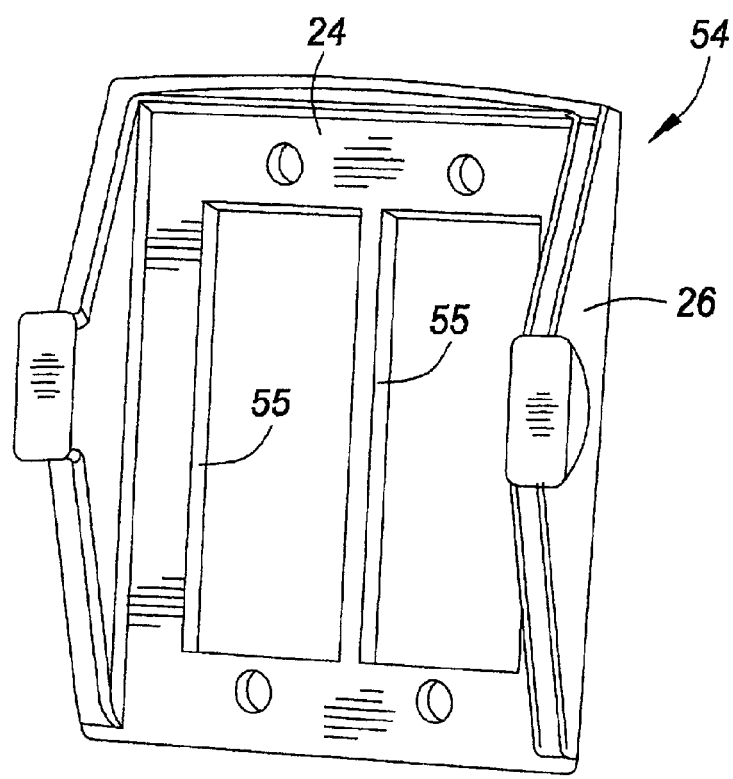
FIGS. 11 and 12 are views similar, respectively, to FIGS. 6 and 7 of a second carrier and connector unit.
Figure 12:
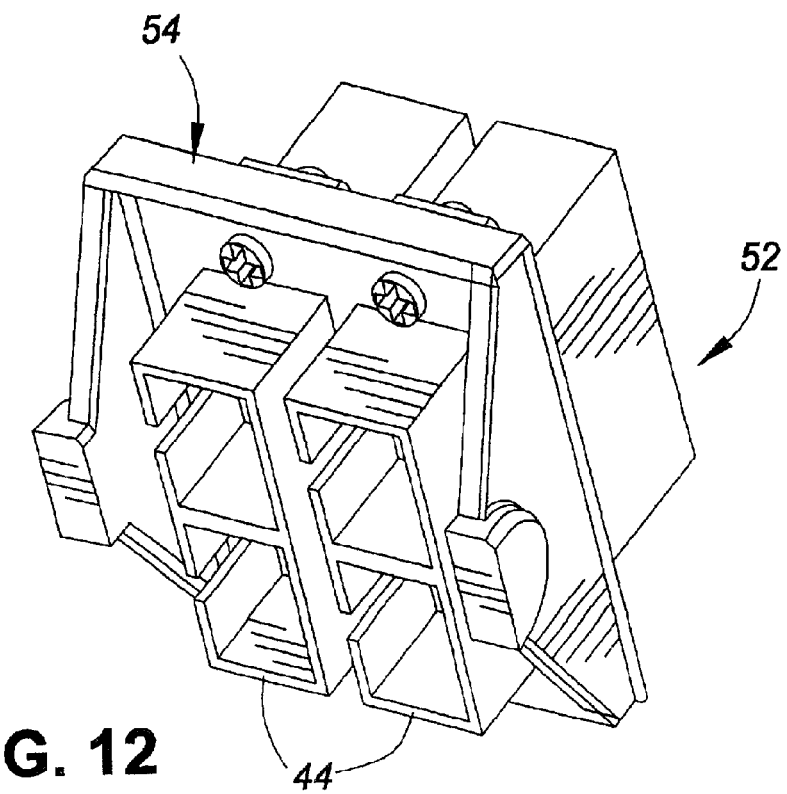
Figure 13:
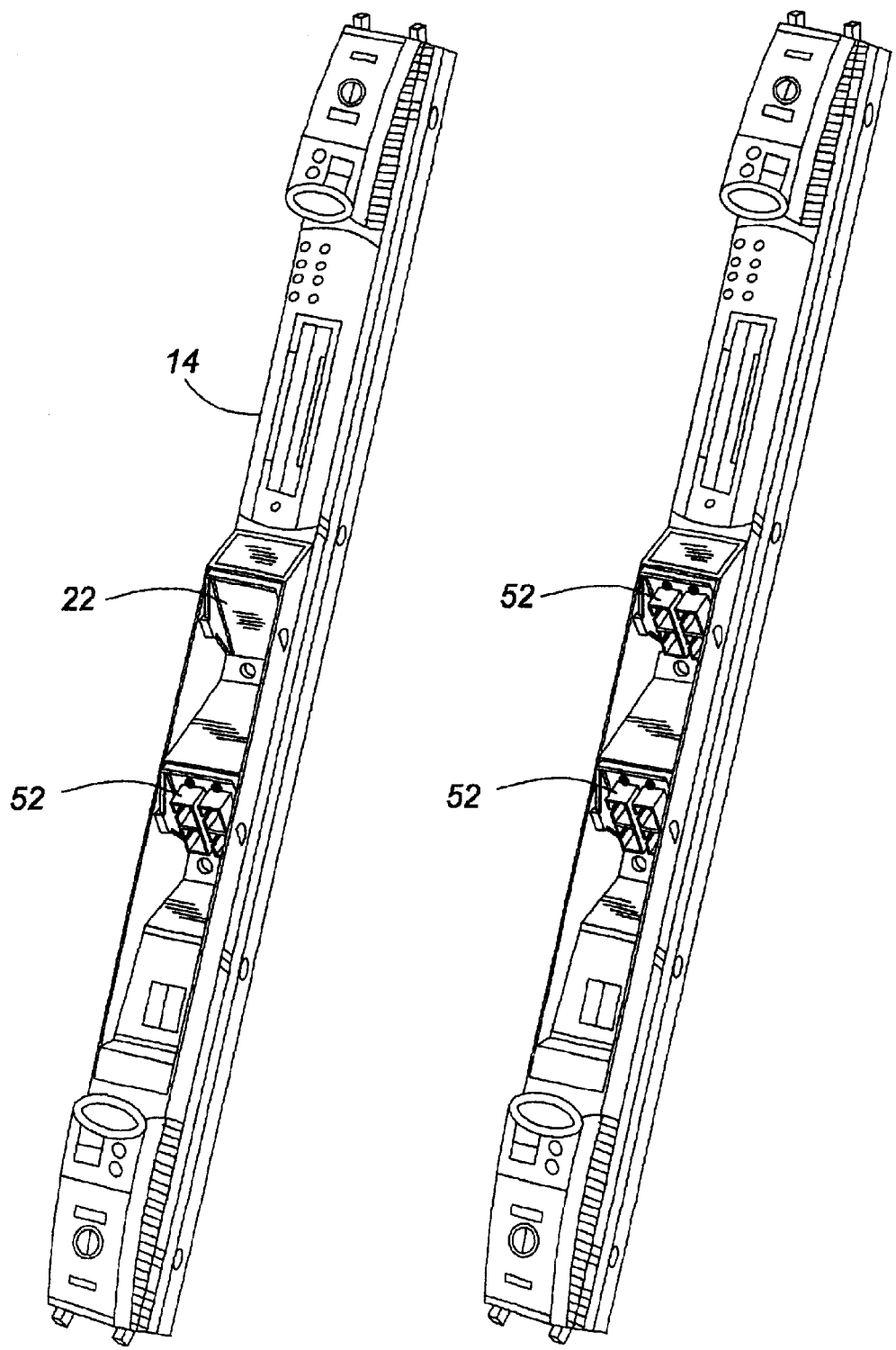
FIG. 13 is a view similar to FIG. 9 and showing the faceplate incorporating, in combination, the second connector unit of FIG. 12.
Figure 14:
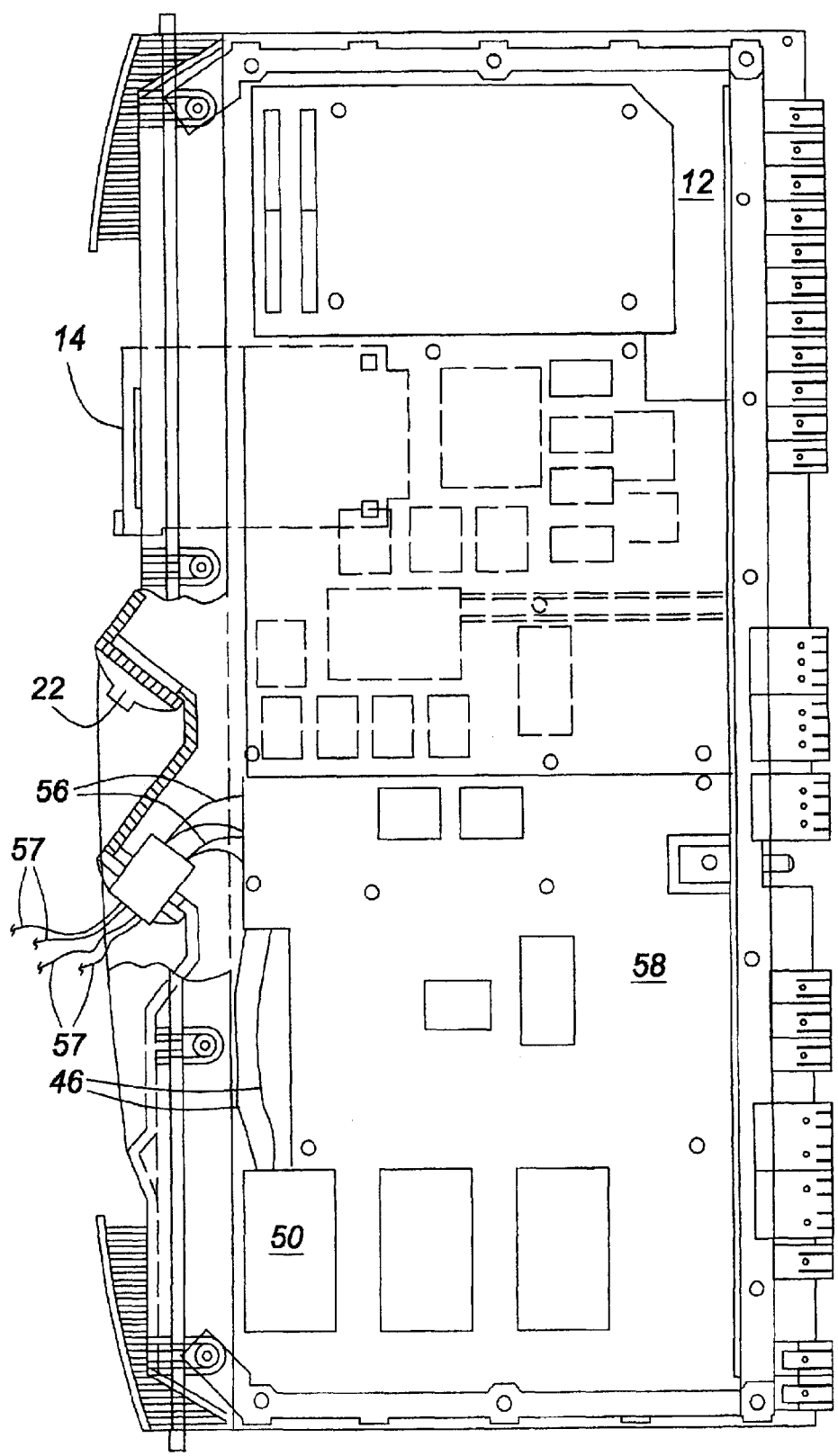
FIG. 14 is a view similar to FIG. 1 and showing conductors of the second connector unit of FIG. 12 extending to terminals of the printed circuit board.

The connector unit 36 or the cover 22 may be replaced by a second connector unit 52 (FIG. 12) having a carrier 54 (FIG. 11). The carrier 54 is similar in construction to the carrier 38 except that the base 24 has no closed region but instead has two side-by-side ports 55 for two dual SC adaptors 44. The connector unit 52 is assembled on to the faceplate in the same manner as the connector unit 36 discussed above. Of four optical cables extending rearwardly, two of these cables 46 are connected to the component 50 and the other two cables 56 are connected to other terminals, as shown by FIG. 14. These terminals may be carried by additional components added at this stage to the printed circuit board as part of the new modification. These additional components may include, for instance, a daughter board 58, as shown by FIG. 14. FIG. 13 shows the front of the faceplate with the connector unit 52 in position. As shown by FIG. 12, each of the cables 46 and 56 is in an in-series interconnection, selectively, to one of four other optical cables 57 which extend forwardly from the faceplate 14.

If any further modification is required to the circuitry, it is merely necessary to remove the upper cover 22 manually, as discussed above for the lower cover, and replace this, again manually, from the front side of the faceplate, and without the need for tools, by a connector of either of the connector units 36 and 52. FIG. 15 is again a front view of the faceplate with both covers 22 removed and two connector units 52 mounted upon the faceplate.

What is claimed is:

1. In combination, a faceplate, a cover and a connector unit for a circuit pack having a printed circuit board extending from a rear side of the faceplate, wherein:

the faceplate has a front side and a rear side, and an opening extending between its front and rear sides, the opening being adapted to receive either the cover or the connector unit;

the connector unit, when inserted in the opening, allows in-series interconnection of two elongate transmission elements, one directed forwardly and the other rearwardly from the faceplate; and the cover, when inserted in the opening, closes the opening against transmission of electromagnetic signals therethrough.

2. A combination according to claim 1, wherein the connector unit has two regions, one of said regions being closed and the other of said regions having a port, the two regions positioned so that with the connector unit in the faceplate opening, the closed region provides the cover for part of the opening and the port of the other region is directed to face through another and open part of the opening for the in-series interconnection of two other elongate transmission elements through the open part, with a first of the other transmission elements extending rearwardly and a second of the other transmission elements extending forwardly of the faceplate.

3. A combination according to claim 2, wherein the connector unit is a first connector unit, and a second connector unit is adapted for insertion in the faceplate opening after removal of the first connector unit therefrom, the second connector unit having two regions corresponding in position to the two regions of the first connector unit, each of the two regions of the second connector unit defining at least one port, each port individually for the in-series interconnection of two of the elongate transmission elements.

4. A combination according to claim 2, wherein quickly releasable means is provided which is co-operable between the faceplate and the connector unit for mounting the connector unit to the faceplate.

5. A combination according to claim 4, wherein the quickly releasable means comprises a latching arrangement.

6. A combination according to claim 5, wherein the faceplate comprises a plurality of mounting flanges and the connector unit is disposable between the mounting flanges with the latching arrangement detachably mounting the connector unit to the flanges.

7. A combination according to claim 6, wherein the latching arrangement comprises latches provided upon the connector unit and latch engaging surfaces upon the mounting flanges.

8. A combination according to claim 5, wherein the connector unit comprises a connector carrier and a connector means carried by the carrier, the carrier provided with part of the latching arrangement.

9. A combination according to claim 8, wherein the carrier comprises a plurality of flanges extending resiliently flexibly from a base of the carrier, the flanges providing part of the latching arrangement.

10. A combination according to claim 6, wherein the mounting flanges extend forwardly from the front side of the faceplate and are accessible at the front side for mounting the connector unit on to the faceplate.

11. A combination according to claim 1, wherein the cover is of a size comparable to that of the opening to enable the cover to be located over and completely cover the opening.

12. A combination according to claim 11, wherein the faceplate is provided with mounting flanges for mounting a connector unit to the faceplate, after removal of the cover to enable the in-series interconnection of the two elongate transmission elements through the at least part of the opening.

13. A combination according to claim 12, wherein the mounting flanges extend forwardly from the front side of the faceplate and are accessible from the front side of the faceplate for mounting the connector unit onto the faceplate.

14. A method of modifying the operation of a circuit pack having a faceplate and a printed circuit board extending from a rear side of the faceplate, the faceplate having a front side and a rear side, and an opening extending between its front and rear sides, the method comprising the step of inserting in the opening either a cover or a connector unit, wherein:

the connector unit, when inserted in the opening, allows in-series interconnection of two elongate transmission elements, one directed forwardly and the other rearwardly from the faceplate; and the cover, when inserted in the opening, closes the opening against transmission of electromagnetic signals through the opening.

15. A method of claim 14, wherein the connector unit has two regions, one of said regions being closed and the other of said regions having a port, the two regions positioned so that with the connector unit in the faceplate opening, the closed region provides the cover for part of the opening and the port of the other region is directed to face through another and open part of the opening for the in-series interconnection of two other elongate transmission elements through the open part, with a first of the other transmission elements extending rearwardly and a second of the other transmission elements extending forwardly of the faceplate.

16. A method of claim 15, further comprising, after inserting the connector unit in the opening, the connector unit being a first connector unit:

removing the first connector unit from the faceplate opening; and replacing the first connector unit with a second connector unit having at least two ports corresponding in position to the two regions of the first connector unit, the two ports directed to face through the opening, each port individually for the in-series interconnection through the port of two elongate transmission elements to be connected to circuitry of the circuit pack, with a first of the transmission elements extending forwardly of the faceplate and a second of the transmission elements extending rearwardly of the faceplate.

* * * * *